United States Patent
Eom et al.

(10) Patent No.: US 8,471,446 B2
(45) Date of Patent: Jun. 25, 2013

(54) POLARIZER AND ORGANIC ELECTROLUMINESCENT DEVICE HAVING THE SAME

(75) Inventors: Sang Yong Eom, Suwon-si (KR); Dong Sub Kim, Suwon-si (KR); Hoon Do Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/032,025

(22) Filed: Feb. 22, 2011

(65) Prior Publication Data

US 2011/0234079 A1   Sep. 29, 2011

(30) Foreign Application Priority Data

Mar. 29, 2010   (KR) ........................ 10-2010-0028050

(51) Int. Cl.
*H01J 5/16* (2006.01)

(52) U.S. Cl.
USPC ............................ 313/112; 313/504; 313/506

(58) Field of Classification Search
USPC ............... 257/40, 72, 98–100, 642–643, 759; 313/498–512, 110–117; 315/169.1, 169.3, 315/169.2; 427/58, 64, 66, 532–535, 539; 428/690–691, 917; 438/26–29, 34, 82, 455; 445/24–25
See application file for complete search history.

(56) References Cited

U.S. PATENT DOCUMENTS

| | | | |
|---|---|---|---|
| 7,755,262 B2 * | 7/2010 | Choi | 313/112 |
| 2002/0158574 A1 * | 10/2002 | Wolk et al. | 313/504 |
| 2003/0085642 A1 * | 5/2003 | Pelka et al. | 313/113 |
| 2004/0189196 A1 * | 9/2004 | Cok | 313/512 |
| 2004/0227698 A1 | 11/2004 | Yamazaki et al. | |
| 2006/0209239 A1 * | 9/2006 | Lin | 349/119 |
| 2007/0081360 A1 * | 4/2007 | Bailey et al. | 362/621 |
| 2008/0157655 A1 * | 7/2008 | Choi et al. | 313/504 |
| 2009/0040443 A1 | 2/2009 | Hada et al. | |
| 2009/0322214 A1 | 12/2009 | Lee et al. | |
| 2010/0133533 A1 * | 6/2010 | Umezaki | 257/43 |
| 2010/0277684 A1 | 11/2010 | Fukushima et al. | |
| 2011/0147773 A1 * | 6/2011 | Kostka | 257/98 |

FOREIGN PATENT DOCUMENTS

| | | |
|---|---|---|
| EP | 1 791 003 A1 | 5/2007 |
| WO | 2009/054168 A1 | 4/2009 |

\* cited by examiner

*Primary Examiner* — Donald Raleigh
(74) *Attorney, Agent, or Firm* — Jefferson IP Law, LLP

(57) ABSTRACT

An organic electroluminescent device is disclosed. The organic electroluminescent device includes a window, a polarizer placed below the window, resin placed between the window and the polarizer, and having a refractive index similar to that of the window and the polarizer, and a self-emissive layer placed below the polarizer. The polarizer includes a polarization layer for polarizing light incident from the outside, a first wave plate for retarding the phase of the polarized incident light, and a second wave plate for retarding the phase of the incident light having passed through the first wave plate.

13 Claims, 3 Drawing Sheets

| | |
|---|---|
| FIRST TAC LAYER | 131 |
| PVA LAYER | 132 |
| SECOND TAC LAYER | 133 |
| FIRST ADHESIVE LAYER | 134 |
| HALF-WAVE PLATE | 135 |
| QUARTER-WAVE PLATE | 136 |
| SECOND ADHESIVE LAYER | 137 |

130

POLARIZER AND ORGANIC ELECTROLUMINESCENT DEVICE HAVING THE SAME

PRIORITY

This application claims the benefit under 35 U.S.C. §119(a) of a Korean patent application filed on Mar. 29, 2010 in the Korean Intellectual Property Office and assigned Serial No. 10-2010-0028050, the entire disclosure of which is hereby incorporated by reference.

BACKGROUND OF THE INVENTION

1. Field of the Invention

The present invention relates to an organic electroluminescent device. More particularly, the present invention relates to an organic electroluminescent (EL) device having a polarizer for realizing "real black" darkness.

2. Description of the Related Art

In order for grayscale to be adjusted on a per pixel basis, transmitted light is modulated according to an input image signal in a liquid crystal display device, and pixels directly radiate light at a luminance level indicated by an input image signal in an organic electroluminescent (EL) device. A layer modulating transmitted light or luminance level for each pixel is referred to as a modulation layer. The liquid crystal layer of a liquid crystal display device and the emission layer of an organic electroluminescent device correspond to the modulation layer.

As the liquid crystal layer is not a light valve completely blocking light, a liquid crystal display device employs two polarizing plates at two sides of the liquid crystal layer (one for the backlight and another for the display screen). To compensate for light loss caused by such polarizing plates, the contrast ratio of such a liquid crystal display device should be boosted.

The emission layer of an organic electroluminescent device does not radiate light when voltage is not applied thereto. Hence, the organic electroluminescent device may realize real black darkness and provide a higher contrast ratio in comparison to a liquid crystal display device. Organic electroluminescent devices do not require a polarizing plate related to the display screen to block light emission during black color display. However, when the organic electroluminescent device is utilized in outdoor activities, the internal metal wiring may reflect light incident from the outside and the contrast ratio may be lowered accordingly. The internal metal wiring may reflect incident light (unrelated to screen display) even during black color display, causing contrast degradation. Accordingly, to prevent contrast degradation due to reflection, the organic electroluminescent device may employ a polarizing member (a combination of a polarizing plate and wave plate) for the display screen.

However, as such configuration includes an air layer having a distinct refractive index between the topmost glass substrate and the polarizing member, the polarizing member may also reflect light incident from the outside of the glass substrate to the inside thereof. A method is desired that not only minimizes reflection of light incident from the outside but also enhances transmittance of self-emissive light.

SUMMARY OF THE INVENTION

An aspect of the present invention is to address the above-mentioned problems and/or disadvantages and to provide the advantages described below. Accordingly, an aspect of the present invention is to provide a polarizer that can not only increase visibility through proper handling of reflection of light but also enhance transmittance of light, and an organic electroluminescent device having the same.

In accordance with an aspect of the present invention, an organic electroluminescent device is provided. The device includes a window, a polarizer placed below the window, resin placed between the window and the polarizer, and having a refractive index similar to that of the window and the polarizer, and a self-emissive layer placed below the polarizer. The polarizer includes a polarization layer for polarizing light incident from the outside, a first wave plate for retarding the phase of the polarized incident light, and a second wave plate for retarding the phase of the incident light having passed through the first wave plate.

In accordance with another aspect of the present invention, a polarizer for an organic electroluminescent device is provided. The polarizer is placed between resin having a similar index of refraction and a self-emissive layer, and includes a polarization layer for polarizing incident light passing through the resin from the outside, a first wave plate for retarding the phase of the polarized incident light, and a second wave plate for retarding the phase of the incident light having passed through the first wave plate.

According to aspects of the present invention, the polarizer and an organic electroluminescent device having the same can prevent reflection of natural light incident from the outside, thereby enhancing viewability of a display apparatus comprising the same.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Particular terms may be defined to describe exemplary embodiments of the present invention. Accordingly, the meaning of specific terms or words used in the specification and the claims should not be limited to the literal or commonly employed sense, but should be construed in accordance with the spirit of the present invention. The description of the various embodiments is to be construed as exemplary only and does not describe every possible instance of the present invention. Therefore, it should be understood that various changes may be made and equivalents may be substituted for elements of the invention.

As described herein, the self-emission layer is based on Active Matrix Organic Light Emitting Diodes (AMOLED). However, exemplary embodiments of the present invention are not limited thereto. The self-emission layer may also be based on Passive Matrix Organic Light Emitting Diodes (PMOLED). Exemplary embodiments of the present invention are applicable to display devices based on self-emissive elements.

Figure 1:
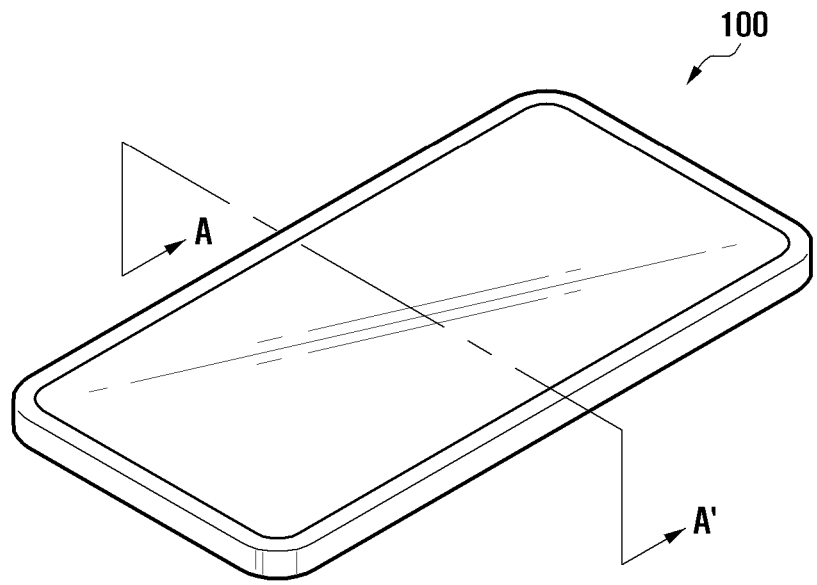
FIG. 1 illustrates the external appearance of an organic electroluminescent device according to an exemplary embodiment of the present invention.
Figure 2:
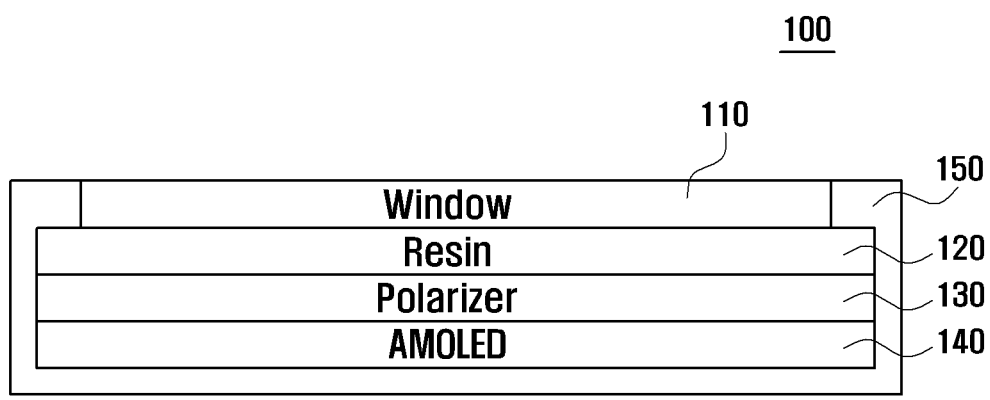
FIG. 2 illustrates a cross section of the organic electroluminescent device along line A-A' in FIG. 1 according to an exemplary embodiment of the present invention.

FIG. 1 illustrates the external appearance of an organic electroluminescent device according to an exemplary embodiment of the present invention, and FIG. 2 illustrates a cross section of the organic electroluminescent device along line A-A' in FIG. 1 according to an exemplary embodiment of the present invention.

Referring to FIGS. 1 and 2, the organic electroluminescent device 100 includes an AMOLED layer 140 corresponding to a modulation layer, a polarizer 130, a resin 120, and a window 110. A case 150 encloses the modulation layer, the polarizer 130, the resin 120, and the window 110.

The resin 120 between the window 110 and the polarizer 130 is adapted to have a refractive index similar to that of the window 110 and the polarizer 130. As a result, the organic electroluminescent device 100 has a structure to prevent reflection by an air layer between the window 110 and the polarizer 130. As the window 110, the resin 120, and the polarizer 130 have a similar refractive index, reflection at the lower surface of the window 110 and at the upper surface of the polarizer 130 (relative to the outside) can be reduced or eliminated.

The polarizer 130 projects reflected light towards the window 110. When the color tones of the layers constituting the polarizer 130 are assumed to be the same, the property of a retardation film strongly influences the reflected color tones of the polarizer 130. The polarizer 130 is designed to include two layers of a quarter-wave plate and a half-wave plate so as to prevent reflection of light incident from the outside for real black darkness, thereby increasing visibility of the organic electroluminescent device 100. Each component is briefly described below.

The AMOLED layer 140 is self-emissive and radiates light using external signals, includes cells arranged in a matrix structure, and adjusts light emission of each cell according to color properties of output data. The AMOLED layer 140 may include a self-emissive layer and a driver part adjusting light radiation and brightness of the self-emissive layer. The AMOLED layer 140 may include a color filter layer placed on the self-emissive layer to represent colors. The AMOLED layer 140 may include a Touch Screen Panel (TSP) on the cells of the self-emissive layer. The AMOLED layer 140 may reflect light incident from the outside of the window 110 through the polarizer 130. The AMOLED layer 140 includes a large number of metallic signal lines to form a matrix cell structure, and these metallic signal lines reflect incident light. Other metallic substances of the AMOLED layer 140 may also reflect incident light. The light incident from the window 110 is circularly-polarized by the polarizer 130, and the circularly-polarized light is reflected by the AMOLED layer 140.

The polarizer 130 includes a member for linearly polarizing light incident from the window 110 and another member for converting the linearly polarized light into circularly polarized light by adjusting the polarization angle. The polarizer 130 projects the circularly polarized light to the AMOLED layer 140. The polarizer 130 may cancel light reflected by the AMOLED layer 140. The polarizer 130 may have a member to remove a particular band of visible light from light reflected by the AMOLED layer 140. To increase the transmittance of light emitted by the AMOLED layer 140, the polarizer 130 may shift the phase of the light, and absorb or polarize a portion of the light within a specified wavelength range. The structure of the polarizer 130 is described below with reference to FIGS. 3 and 4.

The resin 120 is placed between the window 110 and the polarizer 130 to prevent formation of an air layer therebetween. The resin 120 has a refractive index similar to that of the window 110 and the polarizer 130 to prevent light incident from the outside of the window 110 from being reflected at the surface of the window 110 and at the surface of the polarizer 130. The resin 120 may be formed with the window 110 as a single entity during the manufacturing process.

The window 110 is placed on the resin 120, the polarizer 130, and the AMOLED layer 140 and has an edge fixed by the case 150. The window 110 may be made of tempered glass, transparent reinforced plastics, or other transparent material. In the description, it is assumed that a touch screen panel is placed on the cells of the AMOLED layer 140. However, exemplary embodiments of the present invention are not limited thereto. The touch screen panel may be placed on or below the window 110.

The case 150 is configured to enclose the AMOLED layer 140, the polarizer 130, the resin 120, and the window 110. The case 150 is structured to apply proper pressure to the AMOLED layer 140, the polarizer 130, the resin 120, and the window 110 so as to fix them without movement after assembly. The case 150 may include a coupling member such as a hook or screw at one side thereof for pressure application.

As described above, the organic electroluminescent device 100 includes the window 110, the resin 120 and the polarizer 130 that are configured so as to block reflection of light incident from the outside (except for direct reflection by the polarizer 130). The polarizer 130 circularly polarizes incident light with phase retardation by a given angle so that the reflected light is cancelled without transmission. A description of the polarizer 130 in terms of layers, polarization, and reflection removal is provided below with reference to the drawings.

Figures 3, 4:
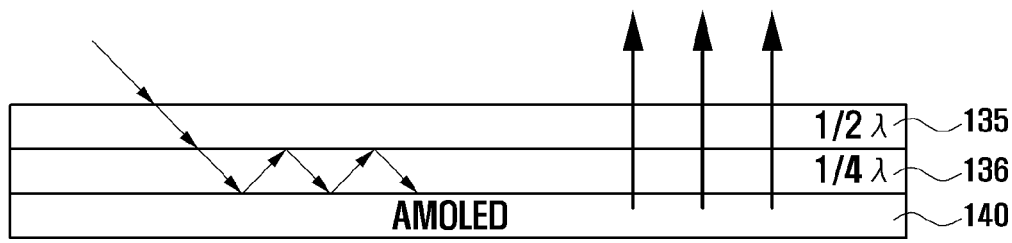
FIG. 3 shows layers constituting a polarizer according to an exemplary embodiment of the present invention.
FIG. 4 illustrates optical behavior of a polarizer according to an exemplary embodiment of the present invention.

FIG. 3 shows layers constituting a polarizer according to an exemplary embodiment of the present invention, and FIG. 4 illustrates optical behavior of a polarizer according to an exemplary embodiment of the present invention.

Referring to FIG. 3, the polarizer 130 includes, from the top, a first triacetyl cellulose (TAC) layer 131, a polyvinyl acetate (PVA) layer 132 for polarization, a second TAC layer 133, a first adhesive layer 134, a first wave plate 135, a second wave plate 136, and a second adhesive layer 137. Prior to describing the features of the polarizer 130, a brief description of polarization is provided to give an understanding of optical transformation performed by the polarizer 130. The types of polarization may include linear polarization, circular polarization and elliptical polarization. Circular polarization and linear polarization may be considered to be special cases of elliptical polarization.

In linear polarization, the electric field vector describes a single line in a plane. The direction of the line may be determined by the vector sum of x and y components. In circular polarization, the x and y components of the electric field vector have the same amplitude and are ninety degrees out of phase, and the electric field vector describes a circle in a plane. Right-hand circular polarization (clockwise) corresponds to a case in which the x component is ninety degrees ahead of the y component, and left-hand circular polarization (counter-clockwise) corresponds to a case in which the x component is ninety degrees behind the y component. Elliptical polarization covers all cases that do not correspond to linear polarization or circular polarization, and the electric field vector rotates, varies in magnitude, and describes an ellipse in a plane.

In the polarizer 130, incident light passing through the window 110 and the resin 120 is linearly polarized by the PVA layer 132. The linearly polarized light is projected through the first wave plate 135 and second wave plate 136 to the AMOLED layer 140. Visible wavelengths of the light reflected by signal lines and others of the AMOLED layer 140 are absorbed by the second wave plate 136 and the first wave plate 135 and are not allowed to pass through the PVA layer 132 toward the outside. The polarizer 130 can reduce/remove light reflection because the polarizer 130 is configured so as to retard the phase of and absorb specific component waves of incident light in a stepwise manner. In addition, the polarizer 130 removes specific component waves of light emitted by the AMOLED layer 140 and passing through the second wave plate 136, the first wave plate 135, and the PVA layer 132 in a stepwise manner, thereby heightening transmittance of radiated light. Each layer will be described below in more detail.

The first TAC layer 131 and the second TAC layer 133 may be made of a TAC film. TAC films may be manufactured using a process composed of reacting cellulose with acetic anhydride to produce TAC resin, doping the TAC resin with a solvent such as methylene chloride, and casting the doped TAC resin into a film. The first TAC layer 131 and the second TAC layer 133 are used as a protective film for the PVA layer 132, and are optically isotropic, highly transparent, physically strong, and dimensionally stable against changes in temperature and humidity. The first TAC layer 131 and the second TAC layer 133 protect the PVA layer 132 together in downward and upward directions. The first TAC layer 131 and the second TAC layer 133 may be made of an anti-glare film, a low-reflection film, or an anti-glare/low-reflection film.

The PVA layer 132 converts unpolarized incident light into polarized light. The PVA layer 132 may be made using a process in which a PVA film is oriented in a solution containing iodine and dichroic dye so as to align iodine molecules and dye molecules together in an orientation direction. As the PVA layer 132 tends to be mechanically weak in the direction of the transmission axis, be contracted owing to heat or moisture, or be degraded in polarization performance, the PVA layer 132 is protected by the first TAC layer 131 and the second TAC layer 133 from damage and contraction.

The first adhesive layer 134 glues the PVA layer 132 (fused with the first and second TAC layers 131 and 133) and the first and second wave plates 135 and 136 together. The second adhesive layer 137 glues the assembled polarizer 130 and the AMOLED layer 140 together.

The first wave plate 135 and the second wave plate 136 are an optical element for changing the polarization state of travelling light. When an electromagnetic wave passes through the first wave plate 135 or the second wave plate 136, the polarization direction thereof (direction of the electric field vector), which is given by the vector sum of two components waves (for example, an extraordinary ray parallel to the optic axis and an ordinary ray perpendicular to the optic axis), is changed as the vector sum of the components varies depending upon the birefringence and thickness of the wave plate.

The first wave plate 135 is a half-wave ($\lambda/2$) plate changing the polarization direction by 180 degrees, and the second wave plate 136 is a quarter-wave ($\lambda/4$) plate changing the polarization direction by 90 degrees. When the second wave plate 136 is a quarter-wave plate, assuming the intensity of light is constant, the light passing through the second wave plate 136 experiences a polarization change given by the equation of a circle due to phase retardation by 90 degrees. X and y coordinates of the transmitted light are given by sine and cosine functions. Accordingly, the light passing through the second wave plate 136 becomes circularly polarized. The first wave plate 135 as a half-wave plate retards the phase of incident light by 180 degrees. The first wave plate 135 converts horizontally polarized incident light into vertically polarized light or converts vertically polarized incident light into horizontally polarized light.

Referring to FIG. 4, when the first wave plate 135 and the second wave plate 136 are placed together as a half-wave plate and as a quarter-wave plate, respectively, the phase of incident light is retarded by 180 degrees by the first wave plate 135, and further retarded by 90 degrees by the second wave plate 136. The light passing through the second wave plate 136 is reflected by signal lines and the like of the AMOLED layer 140, and reenters the second wave plate 136. Owing to phase retardation by 90 degrees, the reflected light reentering the second wave plate 136 is blocked by the first wave plate 135. Consequently, the second wave plate 136 applies anti-reflection treatment to the light having passed therethrough.

The second wave plate 136 may be formed so as to have a fixed transmittance over the entire range of wavelengths corresponding to visible light. The second wave plate 136 having a fixed transmittance for the entire range of visible wavelengths may have relatively low transmission efficiency. To enhance transmission efficiency, the second wave plate 136 may be formed so as to have high transmittance for a range of wavelengths and high absorptance for another range of wavelengths. For example, the second wave plate 136 may be formed so as to have a deposited structure (obtained through dye deposition or the like) which, among red (R), green (G), and blue (B) wavelengths constituting white light, actively absorbs green wavelengths and transmits red and blue wavelengths.

Among red, green, and blue wavelengths, the luminous efficiency of green wavelengths is generally highest. As a result, when the second wave plate 136 has a high absorptance for green wavelengths and a high transmittance for red and blue wavelengths, the second wave plate 136 may have a higher transmittance for white light. However, improving transmittance of the second wave plate 136 by increasing absorptance over a particular wavelength range corresponds to increasing the amount of red and blue light, generating a bluish color on the window 110.

In the polarizer 130, the first wave plate 135 placed on the second wave plate 136 acts to remove such a bluish color effect. The first wave plate 135 retards the phase of light passing therethrough by 180 degrees, which prevents reflected light from passing through the first wave plate 135 (anti-reflection treatment).

For reflected light, incident light is polarized by the PVA layer 132, the phase of the polarized light is retarded by 180 degrees by the first wave plate 135 (for example, horizontal polarization is converted into vertical polarization), the phase of the polarization-changed light is retarded by 90 degrees by the second wave plate 136, and the phase-retarded light is reflected by the AMOLED layer 140 and reenters the second wave plate 136. The reflected light with phase retarded by an additional 90 degrees is blocked by the first wave plate 135 (anti-reflection treatment).

On the other hand, when the second wave plate 136 is formed so as to actively absorb, for example, green wavelengths, the transmitted light with red and blue wavelengths is retarded in phase by an angle greater than or less than 90 degrees (not exactly 90 degrees), and is reflected by the AMOLED layer 140. The reflected light with red and blue wavelengths may pass through the second wave plate 136 and reach the first wave plate 135. Since the reflected light reaching the first wave plate 135 has been polarized by the second wave plate 136, it is blocked by the first wave plate 135.

As the incident light passing through the first wave plate 135 is retarded in phase by 90 degrees by the second wave plate 136 and is reflected by the AMOLED layer 140, and the reflected light is further retarded in phase by 90 degrees by the second wave plate 136, the reflected light reaching the first wave plate 135 has a phase difference of 180 degrees with respect to the incident light passing through the first wave plate 135. The reflected light entering the first wave plate 135 from the second wave plate 136 is removed by the first wave plate 135 upon reflection. Accordingly, the polarizer 130 can suppress reflected light more effectively, provide a higher contrast ratio, and support real black darkness.

The first wave plate 135 is preferably placed on the second wave plate 136 so that the first wave plate 135 and the second wave plate 136 are not tilted with respect to the perpendicular line. When the first wave plate 135 and the second wave plate 136 are arranged so as not to be tilted, they may appropriately remove reflected light. The reflected light reaching the first wave plate 135 from the second wave plate 136 is removed through repeated reflection between the first wave plate 135 and the second wave plate 136.

The first wave plate 135 may provide improved optical performance by increasing absorptance for red and blue wavelengths of light emitted by the AMOLED layer 140 and increasing transmittance for green wavelengths thereof. As described above, since the second wave plate 136 is formed so as to increase absorptance for green wavelengths of light and increase transmittance for red and blue wavelengths, the emitted light reaching the first wave plate 135 may be rich in red and blue wavelengths. Accordingly, the first wave plate 135 may be formed through a process using a dye system or nano oblique angle deposition so as to have a structure which increases absorptance for red and blue wavelengths and increases transmittance for green wavelengths.

Oblique angle deposition combines a regular deposition system with a tilted and rotating substrate to create inclined columnar microstructures, which causes the first wave plate 135 to circularly polarize transmitted light. The inclination of columns may be determined according to a range of wavelengths to be absorbed and a range of wavelengths to be transmitted.

The first wave plate 135 may also be formed using a dye system so as to increase absorptance for a range of wavelengths and increase transmittance for another range of wavelengths. As a result, the first wave plate 135 may remove a bluish color effect by absorbing red and blue wavelengths of light. The thickness of the first wave plate 135 and the second wave plate 136 may be determined according to the amount of birefringence and wavelengths in consideration of phase retardation of 180 degrees and 90 degrees.

As described above, the polarizer 130, including the first wave plate 135 and the second wave plate 136 as a double layer structure, may remove reflection of light incident from the outside using phase retardation induced by the first wave plate 135 and the second wave plate 136. The polarizer 130 may achieve a high transmittance for light emitted by the AMOLED layer 140 using the first wave plate 135 and the second wave plate 136. In the polarizer 130, the absorption axis of the PVA layer 132 (polarizing layer) is tilted at a specific angle with respect to the slow axes of the first wave plate 135 and the second wave plate 136, supporting uniform tones of color over the entire wavelength range. The first wave plate 135 and the second wave plate 136 may be arranged so as to minimize wavelength dispersion during linear-to-circular polarization conversion. For example, the first wave plate 135 may be tilted so that the slow axis thereof forms an angle of 15 degrees with the PVA layer 132 and the second wave plate 136 may be tilted so that the slow axis thereof makes an angle of 60 degrees with the slow axis of the first wave plate 135. Using such an arrangement, the polarizer 130 may enable light to be transmitted with minimum wavelength dispersion and support uniform tones of color over the entire wavelength range.

Optical characteristics of the polarizer 130 described above are summarized in Table 1.

TABLE 1

| Category | | Related Art | | Exemplary Embodiment of Present Invention | |
|---|---|---|---|---|---|
| Luminance | White | 245.33 | | 245.78 | |
| | Black | 0.0026 | | 0.0023 | |
| C/R (Contrast) | | 94357:1 | | 106860:1 | |
| Color coordinates | Red (x/y) | 0.6667 | 0.3327 | 0.6669 | 0.3325 |
| | Green (x/y) | 0.2119 | 0.7270 | 0.2121 | 0.7267 |
| | Blue (x/y) | 0.1401 | 0.0486 | 0.1402 | 0.0483 |
| | Black (x/y) | 0.3822 | 0.5548 | 0.3901 | 0.5527 |
| | White (x/y) | 0.2658 | 0.3065 | 0.2661 | 0.3061 |
| Color temperature | | 9850 | | 9840 | |

Referring to Table 1, according to an exemplary embodiment of the present invention enhancing the transmittance for white light, the luminance ("White") and the contrast are increased. The color coordinates are based on the CIE color coordinates. The red, green, and blue color coordinates are somewhat shifted toward enhancing clarity of the corresponding colors. With reference to component colors for CIE white light, the x-coordinate of red light is shifted to the right and the y-coordinate thereof is shifted downwards, indicating clearer red color. The x-coordinate of green light is shifted to the right and the y-coordinate thereof is shifted downwards, indicating suppression of green color. According to an exemplary embodiment of the present invention, green wavelengths are heavily absorbed by the second wave plate 136 and further slightly absorbed by the first wave plate 135. This may contribute to suppression of green color whose luminous efficiency is higher than other colors, as Table 1 indicates. The y-coordinate of blue color is shifted downwards, indicating clearer blue color. As indicated by Table 1, color transmittance is enhanced and contrast is increased through elimination of refection.

Figure 5:
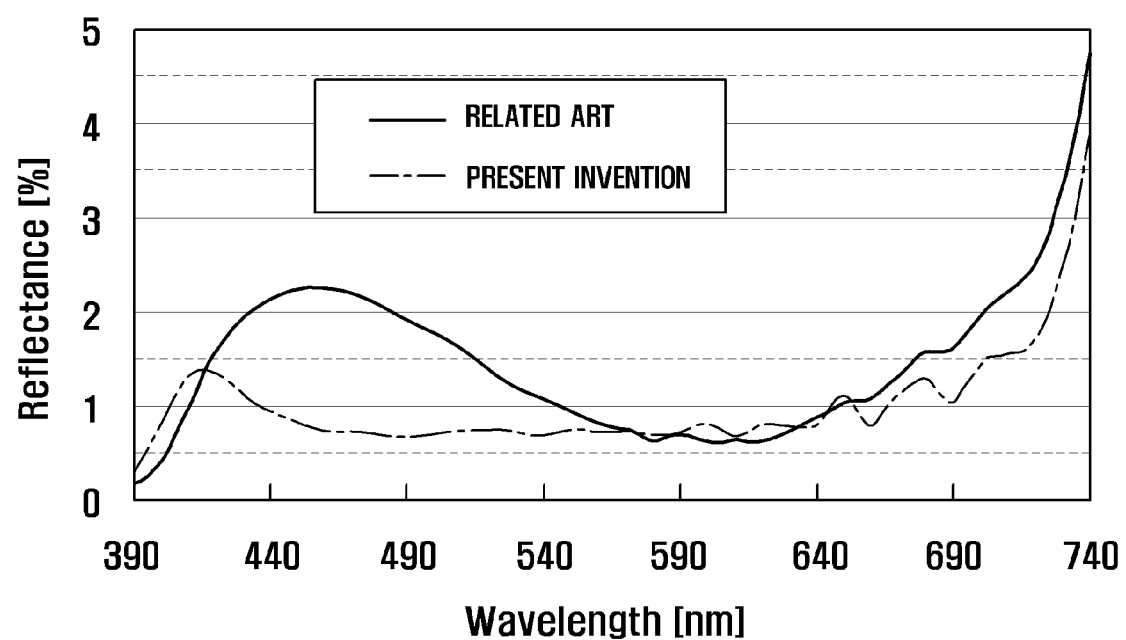
FIG. 5 is a chart illustrating the reflectance of an organic electroluminescent device having a polarizer with respect to visible wavelength according to an exemplary embodiment of the present invention.

FIG. 5 is a chart illustrating the reflectance of an organic electroluminescent device having a polarizer with respect to visible wavelengths according to an exemplary embodiment of the present invention.

Referring to FIG. 5, compared with a related art scheme, the organic electroluminescent device 100 may maintain the reflectance for red, green, and blue wavelengths of visible light at a minimum level (close to non-reflection). This indicates that the organic electroluminescent device 100 having the polarizer 130 evenly removes red, green, and blue wavelengths of reflected light and prevents the bluish color effect.

The second wave plate 136 is described above as increasing absorptance for green wavelengths and increasing transmittance for red and blue wavelengths. However, exemplary embodiments of the present invention are not limited thereto. For example, the second wave plate 136 may be formed so as to increase absorptance for red wavelengths and increase transmittance for green and blue wavelengths, and the first wave plate 135 may be formed so as to increase transmittance for red wavelengths and increase absorptance for green and blue wavelengths. This may be achieved through adjusting the thickness and/or birefringence of the wave plates.

As described above, the organic electroluminescent device 100 including the resin 120 between the window 110 and the polarizer 130 may handle the bluish color effect caused by the polarizer 130 within the polarizer 130 itself, support real black darkness, and improve viewability by boosting contrast. In the organic electroluminescent device 100, the first wave plate 135 and the second wave plate 136 are arranged so as not to be tilted with respect to the perpendicular line, appropriately removing reflection of light incident from the outside (anti-reflection treatment).

The second wave plate 136 may be formed so as to increase absorptance for a first range of visible wavelengths and increase transmittance for a second range of visible wavelengths, and the first wave plate 135 may be formed so as to increase transmittance for the first range of visible wavelengths and increase absorptance for the second range of visible wavelengths. Hence, transmission efficiency of light emitted by the AMOLED layer 140 can be improved. The transmittance and absorptance of the first wave plate 135 and the second wave plate 136 for particular ranges of visible wavelengths may be adjusted using a particular dye system or oblique angle deposition.

The description of the organic electroluminescent device 100 given above focuses on the polarizer 130 from an optical point of view. However, exemplary embodiments of the present invention are not limited thereto or thereby. Although not shown, the organic electroluminescent device 100 may include additional components. These additional components may include a short-range communication module for short-range communication, a camera module for capturing still or moving images of a target object, a data communication interface based on wired and wireless communication, an Internet communication module for Internet access, a digital broadcast receiving module, and other components that realize the functionality of the organic electroluminescent device 100. With the digital convergence trend, it should be apparent to those skilled in the art that the organic electroluminescent device 100 may further include a unit comparable to the above-described units, and one unit of the organic electroluminescent device 100 may be omitted or replaced with another unit.

The organic electroluminescent device 100 having a polarizer 130 may act as a mobile terminal that provides communication services based on various communication schemes. The mobile terminal may be any information and communication appliance or multimedia appliance, such as a mobile communication terminal supporting various communication protocols, a Portable Multimedia Player (PMP), a digital broadcast receiver, a Personal Digital Assistant (PDA), a music player like an MP3 player, a portable game console, a smart phone, or a handheld computer.

Although exemplary embodiments of the present invention have been described in detail above, it should be understood that many variations and modifications of the basic inventive concept herein described, which may appear to those skilled in the art, will still fall within the spirit and scope of the exemplary embodiments of the present invention as defined in the appended claims.

What is claimed is:

1. An organic electroluminescent device comprising:
   a window;
   a polarizer placed below the window;
   resin placed between the window and the polarizer, and having a refractive index similar to that of the window and the polarizer; and
   a self-emissive layer placed below the polarizer,
   wherein the polarizer comprises:
      a polarization layer for linearly polarizing light incident from the outside and passing therethrough;
      a first wave plate for retarding a phase of the polarized incident light by a first predetermined amount; and
      a second wave plate for retarding the phase of the incident light having passed through the first wave plate by a second predetermined amount, and for further retarding the phase of reflected light having passed through the first and second wave plates and reflected back through the second wave plate by the second predetermined amount,
   wherein the first and second predetermined amounts are configured such that the reflected light is blocked by the first wave plate,
   wherein the first wave plate is formed so as to increase absorptance for a first range of visible wavelengths and increase transmittance for a second range of visible wavelengths, and
   wherein the second wave plate is formed so as to increase absorptance for the second range of visible wavelengths and increase transmittance for the first range of visible wavelengths.

2. The organic electroluminescent device of claim 1, wherein the first wave plate comprises a half-wave plate and the second wave plate comprises a quarter-wave plate.

3. The organic electroluminescent device of claim 2, wherein the first wave plate is tilted so that the slow axis thereof forms an angle of 15 degrees with the absorption axis of the polarization layer and the second wave plate is tilted so that the slow axis thereof forms an angle of 60 degrees with the slow axis of the first wave plate.

4. The organic electroluminescent device of claim 1, wherein the first wave plate is formed so as to absorb red (R) and blue (B) wavelengths of visible light.

5. The organic electroluminescent device of claim 4, wherein the second wave plate is formed so as to actively absorb green (G) wavelengths of visible light and efficiently transmit R and B wavelengths.

6. A polarizer for an organic electroluminescent device, the polarizer being placed between resin having a similar index of refraction and a self-emissive layer, the polarizer comprising:
   a polarization layer for linearly polarizing incident light passing through the resin from the outside;
   a first wave plate for retarding a phase of the polarized incident light by a first predetermined amount; and
   a second wave plate for retarding the phase of the incident light having passed through the first wave plate by a second predetermined amount, and for further retarding the phase of reflected light having passed through the first and second wave plates and reflected back through the second wave plate by the second predetermined amount,
   wherein the first and second predetermined amounts are configured such that the reflected light is blocked by the first wave plate,
   wherein the first wave plate is formed so as to increase absorptance for a first range of visible wavelengths and increase transmittance for a second range of visible wavelengths, and
   wherein the second wave plate is formed so as to increase absorptance for the second range of visible wavelengths and increase transmittance for the first range of visible wavelengths.

7. The polarizer of claim 6, wherein the first wave plate comprises a half-wave plate and the second wave plate comprises a quarter-wave plate.

8. The polarizer of claim 7, wherein the first wave plate is tilted so that the slow axis thereof forms an angle of 15 degrees with the absorption axis of the polarization layer and the second wave plate is tilted so that the slow axis thereof forms an angle of 60 degrees with the slow axis of the first wave plate.

9. The polarizer of claim 6, wherein the first wave plate is formed so as to absorb red (R) and blue (B) wavelengths.

10. The polarizer of claim 9, wherein the second wave plate is formed so as to actively absorb green (G) wavelengths of visible light and efficiently transmit R and B wavelengths.

11. The polarizer of claim 6, wherein the polarizer further comprises:
   a first triacetyl cellulose layer;
   a second triacetyl cellulose layer; and
   a polyvinyl acetate layer arranged between the first and second triacetyl cellulose layers.

12. The polarizer of claim 11, wherein the polarizer further comprises:
   a first adhesive layer for adhering the second triacetyl cellulose layer to the first wave plate; and
   a second adhesive layer for adhering the second wave plate to the self-emissive layer.

13. The polarizer of claim 11, wherein the polarizer is a component of a display unit of a mobile device.

* * * * *